United States Patent
Takahashi

(10) Patent No.: US 8,456,554 B2
(45) Date of Patent: Jun. 4, 2013

(54) INTEGRATED AD CONVERTER, SOLID STATE IMAGING DEVICE, AND CAMERA SYSTEM

(75) Inventor: Tomohiro Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 539 days.

(21) Appl. No.: 12/659,585

(22) Filed: Mar. 15, 2010

(65) Prior Publication Data

US 2010/0271525 A1    Oct. 28, 2010

(30) Foreign Application Priority Data

Apr. 24, 2009  (JP) .................................. 2009-107105

(51) Int. Cl.
*H04N 5/335*  (2006.01)
*H03M 1/34*   (2006.01)

(52) U.S. Cl.
USPC ........................ 348/294; 341/164; 250/208.1

(58) Field of Classification Search
USPC ......................................... 348/294, 297, 308
See application file for complete search history.

(56) References Cited

U.S. PATENT DOCUMENTS

| | | | | |
|---|---|---|---|---|
| 2005/0242849 | A1* | 11/2005 | Muramatsu et al. | 327/151 |
| 2006/0001750 | A1* | 1/2006 | Mizuguchi et al. | 348/294 |
| 2008/0094494 | A1* | 4/2008 | Lee et al. | 348/294 |
| 2009/0002527 | A1* | 1/2009 | Higuchi | 348/243 |

FOREIGN PATENT DOCUMENTS

JP    2008-092091    4/2008

* cited by examiner

*Primary Examiner* — Chieh M Fan
*Assistant Examiner* — Dwight C Tejano
(74) *Attorney, Agent, or Firm* — Rader, Fishman & Grauer PLLC

(57) ABSTRACT

An integrated AD converter includes: a comparator comparing an input voltage with a reference voltage with a ramp waveform whose voltage value linearly changes with time; a high-bit counter triggered by inversion of an output signal of the comparator to start or stop an operation of counting for every cycle of a main clock signal; a time quantizer latching phase information at a timing at which the output signal is inverted using a plurality of clock signals including main clock signals of different phases, and decodes a value of the latched phase information to thereby output lower bits with a resolution higher than a clock cycle; and a regulating unit synchronizing the output signal with the main clock signal, and determines timings of starting and stopping the operation of the high-bit counter and a value for latching the phase information of the main clock signal using a signal resulting from the synchronization.

9 Claims, 16 Drawing Sheets

FIG.3

| EXPECTED VALUE | | HELD VALUE | | ERROR |
|---|---|---|---|---|
| Bin | Dec | Bin | Dec | |
| 0000b | 0 | 1000b | 7 | +7 |
| | | 0001b | 1 | +1 |
| 0001b | 1 | 0000b | 0 | -1 |
| | | 0011b | 2 | +1 |
| 0011b | 2 | 0001b | 1 | -1 |
| | | 0111b | 3 | +1 |
| 0111b | 3 | 0011b | 2 | -1 |
| | | 1111b | 4 | +1 |

| EXPECTED VALUE | | HELD VALUE | | ERROR |
|---|---|---|---|---|
| Bin | Dec | Bin | Dec | |
| 1111b | 4 | 0111b | 3 | -1 |
| | | 1110b | 5 | +1 |
| 1110b | 5 | 1111b | 4 | -1 |
| | | 1100b | 6 | +1 |
| 1100b | 6 | 1110b | 5 | -1 |
| | | 1000b | 7 | +1 |
| 1000b | 7 | 1100b | 6 | -1 |
| | | 0000b | 0 | -7 |

RELATED ART

INTEGRATED AD CONVERTER, SOLID STATE IMAGING DEVICE, AND CAMERA SYSTEM

BACKGROUND OF THE INVENTION

1. Field of the Invention

The present invention relates to an integrated analog-to-digital converter (hereinafter called "integrated AD converter") which is adaptable to a solid state imaging device typified by a CMOS image sensor, a solid state imaging device, and a camera system.

2. Description of the Related Art

There has been proposed an integrated AD converter mountable in, for example, a solid state imaging device which performs high-resolution imaging (see JP-A-2008-92091 (Patent Document 1)).

Patent Document 1 has proposed an integrated AD converter which enhances the resolution without increasing the clock frequency.

This integrated AD converter acquires information on lower bits by means of a time quantizer (TDC: Time-to-Digital Converter) which latches and decodes clock signals of different phases using an ordinary high-bit counter and ring oscillator, thereby enhancing the resolution without increasing the clock frequency.

FIG. 1 is a diagram showing the configuration of the AD converter disclosed in Patent Document 1.

This AD converter 1 has a comparator 2, a TDC (time quantizer, latch and decoder) 3, a high-bit counter 4, and a transfer bus 5.

The AD converter 1 in this example is an integrated AD converter which uses four clock signals of phases different from one another by 45 degrees, and has a resolution of a total of fourteen bits including eleven bits for the high-bit counter and three bits for the low-bit TDC 3.

The comparator 2 compares an input voltage VSL with a reference voltage RAMP with a ramp waveform whose voltage value linearly changes with time, and outputs the comparison result as a signal VCO.

The high-bit counter 4 starts or stops the operation at a timing at which the signal VCO is changed, and the low-bit TDC 3 latches information on clock signals of different phases.

FIG. 2 is a diagram showing the principle of the low-bit TDC which provides a higher resolution than the clock frequency.

When the values of four clock signals CLKA, CLKB, CLKC and CLKD whose phases differ from one another by 45 degrees are latched at a timing at which the signal VCO changes in one cycle of the clock frequency, eight extending codes EB [3:0] are obtained.

Lower-bit information of three bits can be acquired by decoding the eight extending codes by means of the latch and decoding section of the TDC 3.

This example is a post counting type in which the high-bit counter 4 starts counting at the timing at which the signal VCO changes.

FIG. 3 is a diagram showing changes in binary values of the extending codes EB [3:0] obtained when the timing at which the signal VCO changes is changed around the edge of each clock, and decoding results.

Normally, a change in a decoded value is ±1 LSB and is sequential. However, an error of ±7 LSB occurs around the rising edge of the clock signal CLKA, depending on the connection to the high-bit ripple counter. This error is called "sparkle error".

FIGS. 4A and 4B are diagrams showing a case where proper counting is carried out consecutively at the joint portion of the high-bit counter and the low-bit TDC, and a case where a sparkle error occurs at that joint portion.

The clock signal CLKA serves as the clock signal for the high-bit counter 4 and the clock signal for the low-bit TDC 3.

A sparkle error may occur when the signal VCO changes around the rising edge of the clock signal CLKA.

When the signal VCO changes slightly before the rising edge of the clock signal CLKA, [0000b] is stored as the extending code EB [3:0], and when the high-bit counter 4 counts immediately thereafter at the rising edge of the clock signal CLKA, it is the proper counting.

When the signal VCO changes slightly after the rising edge of the clock signal CLKA, [1000b] is stored as the extending code EB [3:0].

It is also the proper counting when the high-bit counter 4 does not count immediately before the rising edge of the clock signal CLKA, and waits for the next rising edge.

SUMMARY OF THE INVENTION

However, when the timing at which the extending code is latched in the low-bit TDC and the timing at which the high-bit counter starts counting are different, there occurs a phenomenon of reversing the above relation as follows.

Namely, when the signal VCO changes slightly before the rising edge of the clock signal CLKA, [0000b] is stored as the extending code EB [3:0].

When the high-bit counter 4 does not count immediately thereafter at the rising edge of the clock signal CLKA, or when the signal VCO changes slightly after the rising edge of the clock signal CLKA, [1000b] is stored as the extending code EB [3:0].

However, the high-bit counter 4 may count immediately before the rising edge of the clock signal CLKA. In this case, a sparkle error occurs.

According to the system described in Patent Document 1, separate signals equivalent to the signal VCO are respectively input to the high-bit counter 4 and the low-bit TDC 3, and there are circuit delays in the components.

It is not therefore possible to strictly guarantee that the timing at which the high-bit counter 4 stops counting is the same as the timing at which the low-bit TDC 3 latches phase information, so that a sparkle error is likely to occur.

It is therefore desirable to provide an integrated AD converter, a solid state imaging device, and a camera system which can prevent occurrence of a sparkle error.

According to an embodiment of the present invention, there is provided an integrated AD (analog-to-digital) converter including a comparator that compares an input voltage with a reference voltage with a ramp waveform whose voltage value linearly changes with time; a high-bit counter that is triggered by inversion of an output signal of the comparator to start or stop an operation of counting for every cycle of a main clock signal; a time quantizer that latches phase information at a timing at which the output signal of the comparator is inverted using a plurality of clock signals including main clock signals of different phases, and decodes a value of the latched phase information to thereby output lower bits with a resolution higher than a clock cycle; and a regulating unit that synchronizes the output signal of the comparator with the main clock signal, and determines timings of starting and stopping the operation of the high-bit counter and a value for latching the phase information of the main clock signal by using a signal resulting from the synchronization.

According to another embodiment of the present invention, there is provided a solid state imaging device including an pixel part having a matrix array of a plurality of pixels for performing photoelectric conversion; and a pixel signal reading part that reads pixel signals from the pixel part in units of a plurality of pixels, the pixel signal reading part having integrated AD (analog-to-digital) converters provided in correspondence to columns of pixels to convert read analog signals to digital signals, each of the integrated AD converters including a plurality of comparators that are supplied with a reference voltage with a ramp waveform and compare the supplied reference voltage with potentials of analog signals read from the corresponding column of pixels; a comparator that compares the potentials of the analog signals read from the corresponding column of pixels with the reference voltage with the ramp waveform whose voltage value linearly changes with time; a high-bit counter that is triggered by inversion of an output signal of the comparator to start or stop an operation of counting for every cycle of a main clock signal; a time quantizer that latches phase information at a timing at which the output signal of the comparator is inverted using a plurality of clock signals including main clock signals of different phases, and decodes a value of the latched phase information to thereby output lower bits with a resolution higher than a clock cycle; and a regulating unit that synchronizes the output signal of the comparator with the main clock signal, and determines timings of starting and stopping the operation of the high-bit counter and a value for latching the phase information of the main clock signal by using a signal resulting from the synchronization.

According to still another embodiment of the present invention, there is provided a camera system including a solid state imaging device; and an optical system that forms an image of a subject on the solid state imaging device, the solid state imaging device having an pixel part having a matrix array of a plurality of pixels for performing photoelectric conversion, and a pixel signal reading part that reads pixel signals from the pixel part in units of a plurality of pixels, the pixel signal reading part having integrated AD (analog-to-digital) converters provided in correspondence to columns of pixels to convert read analog signals to digital signals, each of the integrated AD converters including a plurality of comparators that are supplied with a reference voltage with a ramp waveform and compare the supplied reference voltage with potentials of analog signals read from the corresponding column of pixels; a comparator that compares the potentials of the analog signals read from the corresponding column of pixels with the reference voltage with the ramp waveform whose voltage value linearly changes with time; a high-bit counter that is triggered by inversion of an output signal of the comparator to start or stop an operation of counting for every cycle of a main clock signal; a time quantizer that latches phase information at a timing at which the output signal of the comparator is inverted using a plurality of clock signals including main clock signals of different phases, and decodes a value of the latched phase information to thereby output lower bits with a resolution higher than a clock cycle; and a regulating unit that synchronizes the output signal of the comparator with the main clock signal, and determines timings of starting and stopping the operation of the high-bit counter and a value for latching the phase information of the main clock signal by using a signal resulting from the synchronization.

According to the embodiments of the present invention, occurrence of a sparkle error can be prevented.

BRIEF DESCRIPTION OF THE DRAWINGS

FIG. 3 is a diagram showing changes in binary values of the extending codes EB [3:0] obtained when the timing at which the signal VCO changes is changed around the edge of each clock, and decoding results;

DETAILED DESCRIPTION OF THE PREFERRED EMBODIMENTS

Preferred embodiments of the present invention will be described below with reference to the accompanying drawings.

The description will be given in the following order.

1. First Embodiment (Configurational Example of AD Converter)

2. Second Embodiment (Example of General Configuration of Solid State Imaging Device)

3. Third Embodiment (Configurational Example of Camera System)

<1. First Embodiment>
[Configurational Example of AD Converter]

Figure 1:
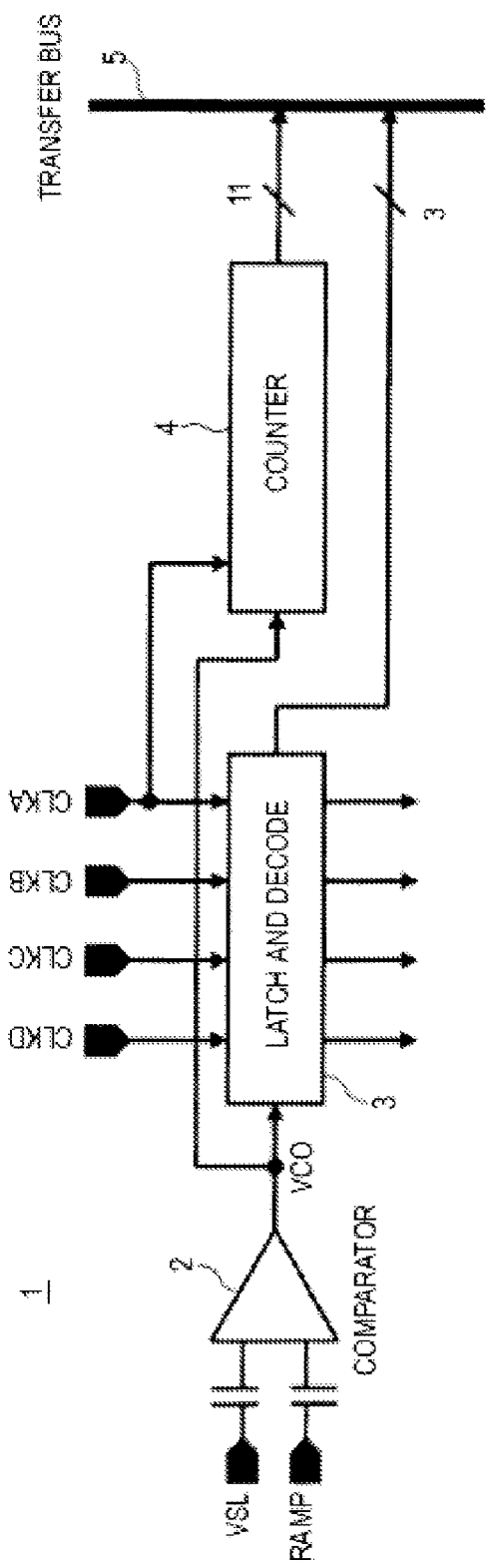
FIG. 1 is a diagram showing the configuration of the AD converter disclosed in Patent Document 1.
Figure 2:
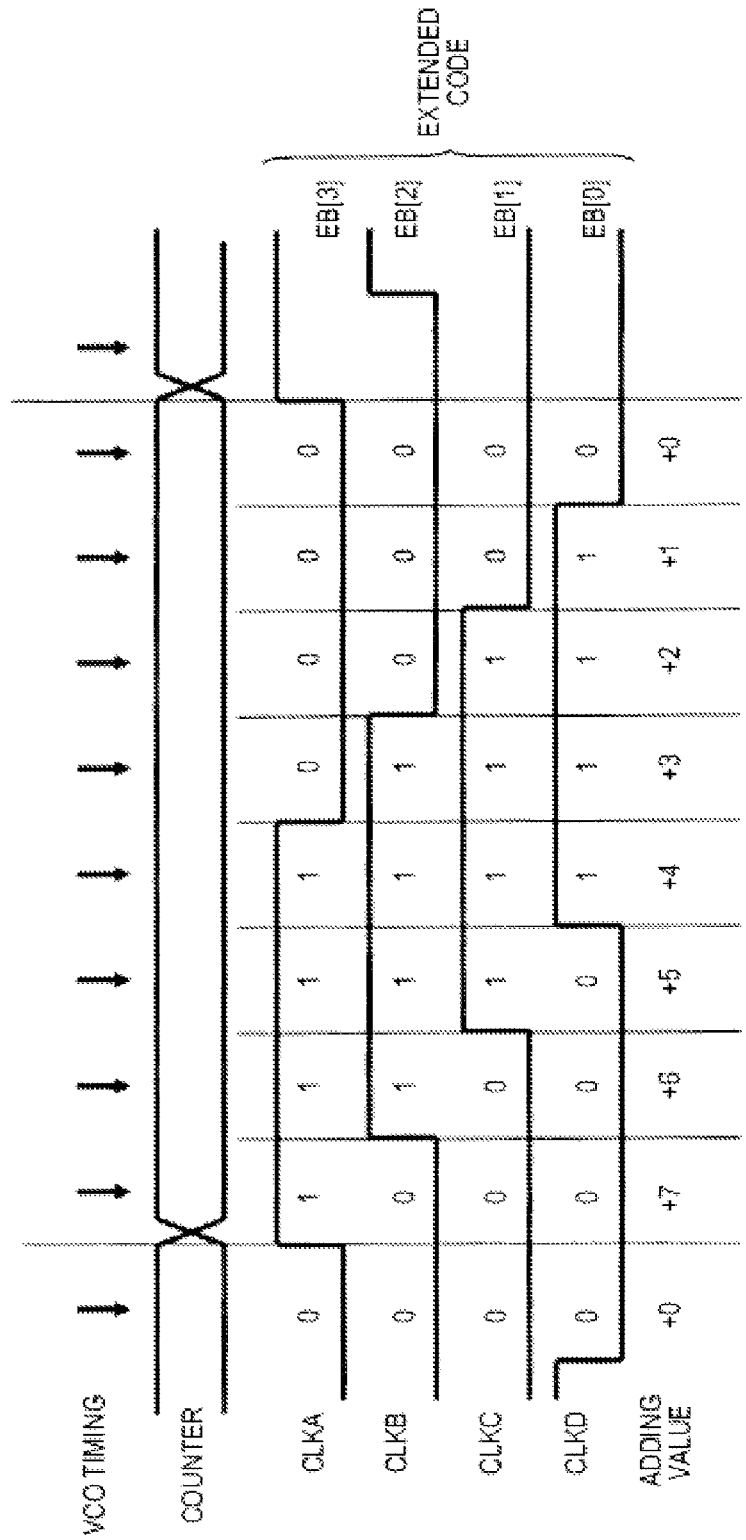
FIG. 2 is a diagram showing the principle of the low-bit TDC which provides a higher resolution than the clock frequency.
Figure 4A:
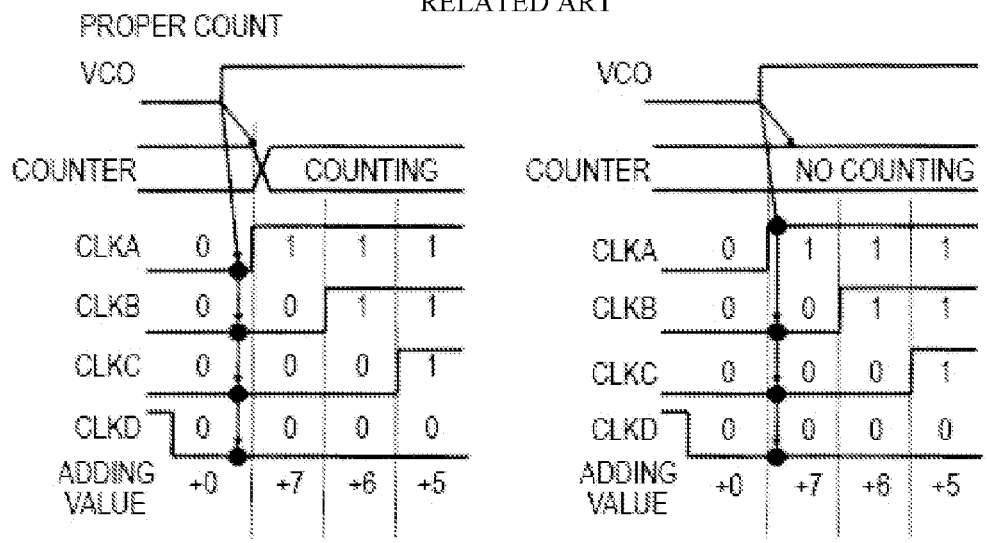
FIGS. 4A and 4B are diagrams showing a case where proper counting is carried out consecutively at the joint portion of the high-bit counter and the low-bit TDC, and a case where a sparkle error occurs at that joint portion.
Figure 4B:
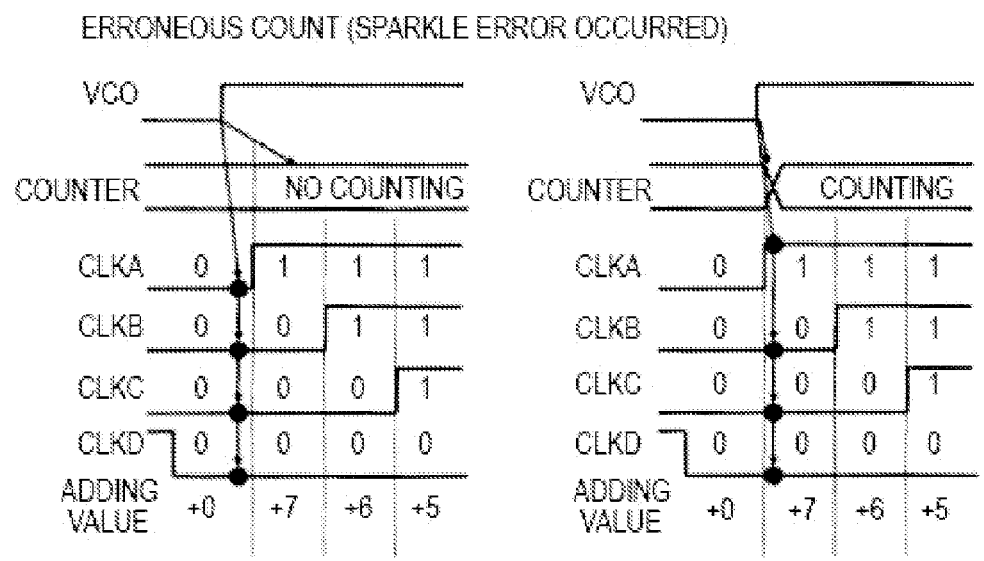
Figure 5:
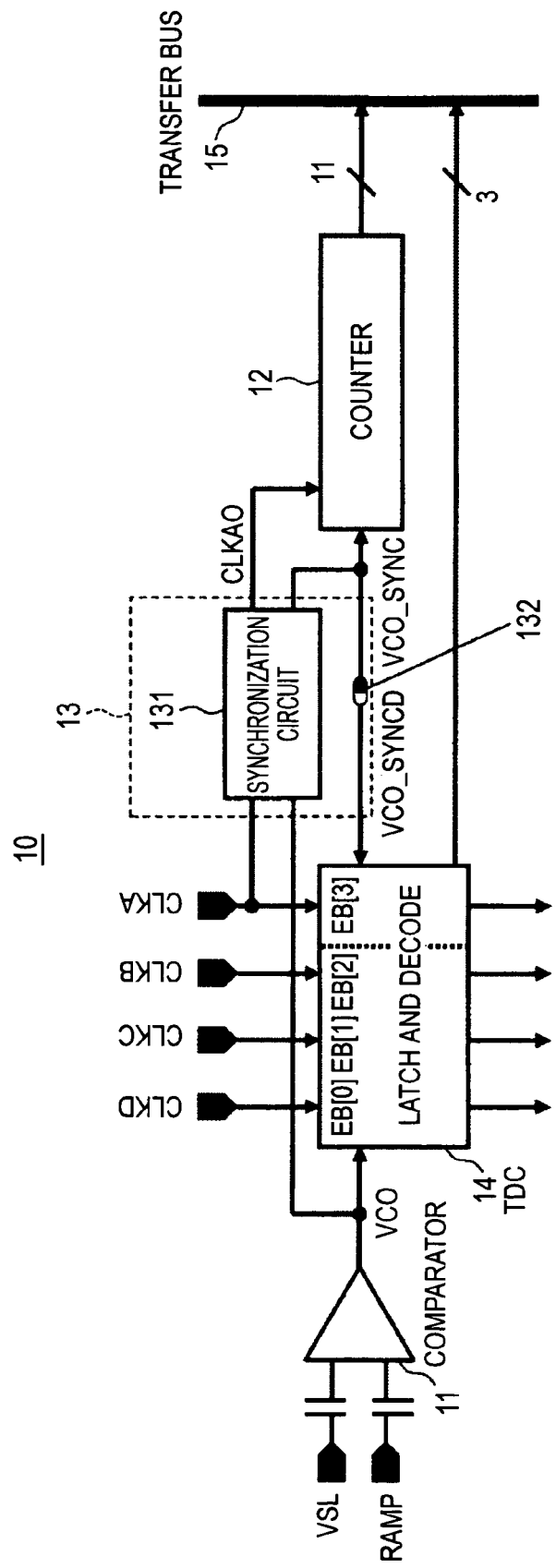
FIG. 5 is a diagram showing a configurational example of an integrated AD converter according to a first embodiment of the invention.

FIG. 5 is a diagram showing a configurational example of an integrated AD converter according to a first embodiment of the invention.

An integrated AD converter 10 according to the first embodiment has a comparator 11, a high-bit counter 12, a regulating unit 13, a TDC (Time-to-Digital Converter; time quantizer) 14, and a transfer bus 15.

The comparator 11 compares an input voltage VSL with a reference voltage RAMP having a ramp waveform whose voltage value linearly changes with time, and outputs a signal VCO with a level according to the comparison result to the regulating unit 13 and the TDC 14.

The high-bit counter 12 basically has a function of starting or stopping a counting operation to count for every cycle of a main clock signal CLKA when triggered by inversion of the output signal VCO of the comparator 11.

The high-bit counter 12 is triggered by a count operation start signal VCO_SYNC, generated by synchronizing the output signal VCO of the comparator 11 with the main clock signal CLKA by the regulating unit 13, to count for every cycle of a main clock signal CLKAO output from the regulating unit 13.

The regulating unit 13 synchronizes the output signal VCO of the comparator 11 with the main clock signal CLKA, and determines the timings of starting and stopping the operation of the high-bit counter 12 and a value for latching phase information of the main clock signal CLKA by using a signal resulting from the synchronization.

The regulating unit 13 has a synchronization circuit 131 which synchronizes the output signal VCO of the comparator 11 at both of the rising edge and the falling edge of the main clock signal CLKA, and outputs the synchronized signal as a count operation start signal VCO_SYNC.

The regulating unit 13 has a function of generating a latch timing signal VCO_SYNCD for latching phase information of the main clock signal CLKA based on the count operation start signal VCO_SYNC and outputting the latch timing signal VCO_SYNCD to the TDC 14.

The regulating unit 13 includes a delay unit 132 which delays the count operation start signal VCO_SYNC to generate the latch timing signal VCO_SYNCD and outputs the latch timing signal VCO_SYNCD to the TDC 14.

Figure 6:
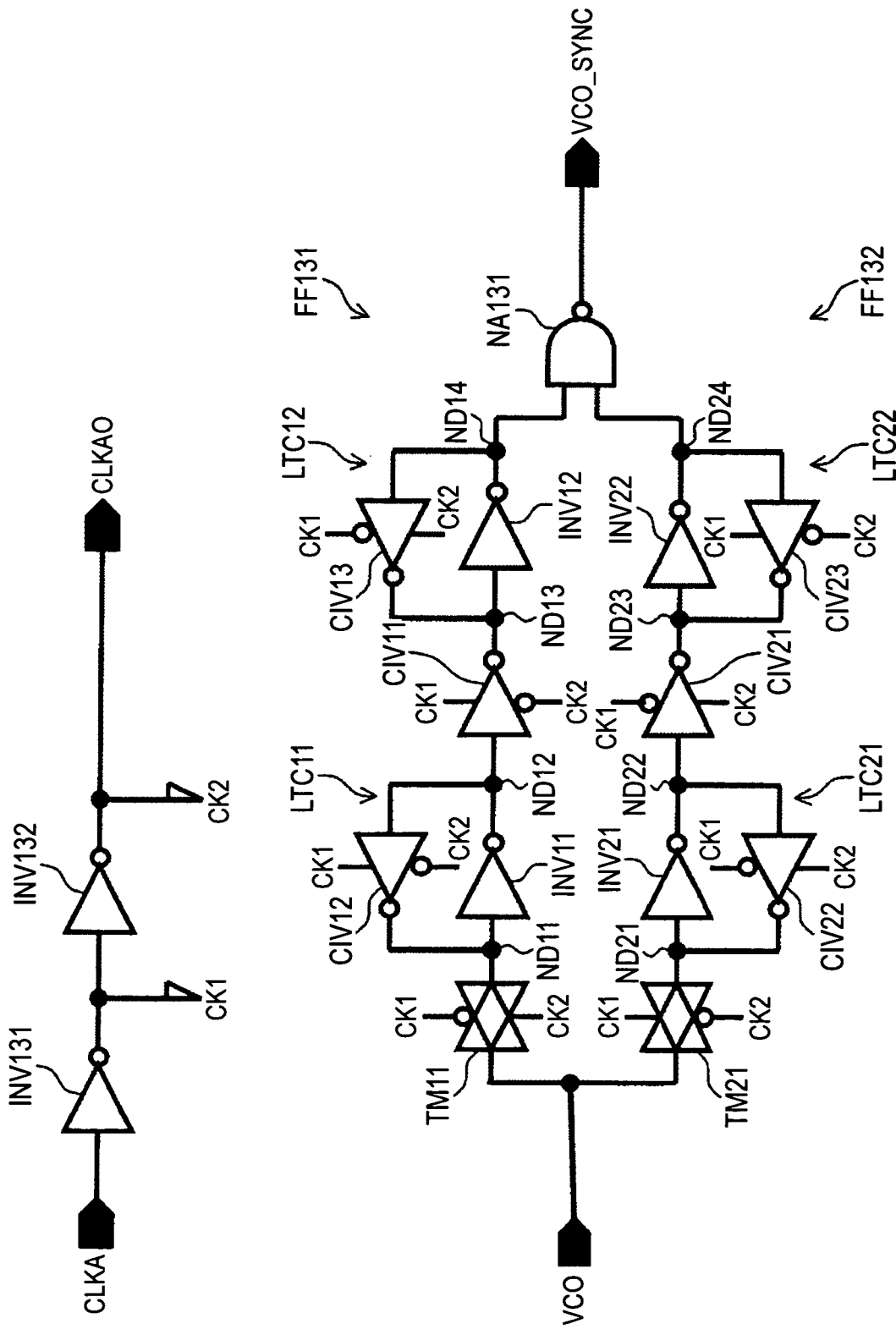
FIG. 6 is a circuit diagram showing a configurational example of a synchronization circuit in a regulating unit according to the embodiment.

FIG. 6 is a circuit diagram showing a configurational example of the synchronization circuit in the regulating unit according to the embodiment.

FIG. 6 is a circuit diagram of the gate level of the synchronization circuit 131.

Since the synchronization circuit 131 needs to synchronize the output signal VCO of the comparator 11 at both of the rising edge and the falling edge of the clock signal CLKA, the synchronization circuit 131 has two flip-flops (FFs) 131 and 132, and a NAND gate NA131.

The synchronization circuit 131 also has series-connected inverters INV131 and INV132 which delay the main clock signal CLKA to generate a clock signal CLKAO, and outputs the clock signal CLKAO to the high-bit counter 12.

In the embodiment, a clock signal CK1 output from the inverter INV131 and a clock signal CK2 output from the inverter INV132 are input to the FF 131 and FF 132 as clock signals.

It is to be noted that the main clock signal CLKA and the clock signal CK1 output from the inverter INV131 can be supplied as clock signals to the FF 131 and FF 132.

The FF 131 has a transfer gate TM11 at an input stage, a latch LTC11, a clocked inverter CIV11, a latch LTC12, and nodes ND11 to ND14.

The latch LTC11 is formed by an inverter INV11 and a clocked inverter CIV12.

The latch LTC12 is formed by an inverter INV12 and a clocked inverter CIV11.

The transfer gate TM11 is formed by coupling the sources and drains of a PMOS transistor and an NMOS transistor together. The clock signal CK1 is supplied to the gate of the PMOS transistor, and the clock signal CK2 is supplied to the gate of the NMOS transistor.

The transfer gate TM11 has one input/output terminal connected to a supply line for the output signal VCO of the comparator 11, and the other input/output terminal connected to the node ND11.

In the latch LTC11, the inverter INV11 has an input terminal connected to the node ND11, and an output terminal connected to the node ND12. A clocked inverter CIV12 has an input terminal connected to the node ND12, and an output terminal connected to the node ND11.

The clocked inverter CIV12 is supplied with the clock signal CK1 at its positive clock terminal and the clock signal CK2 at its negative clock terminal.

The clocked inverter CIV11 has an input terminal connected to the node ND12, and an output terminal connected to the node ND13.

The clocked inverter CIV11 is supplied with the clock signal CK1 at its positive clock terminal and the clock signal CK2 at its negative clock terminal.

In the latch LTC12, the inverter INV12 has an input terminal connected to the node ND13, and an output terminal connected to the node ND14. A clocked inverter CIV13 has an input terminal connected to the node ND14, and an output terminal connected to the node ND13.

The clocked inverter CIV13 is supplied with the clock signal CK1 at its negative clock terminal and the clock signal CK2 at its positive clock terminal.

The node ND14 as the output node of the latch LTC12 is connected to one input terminal of the NAND gate NA131.

The FF 131 with the foregoing configuration latches the output signal VCO of the comparator 11 into the latch LTC11 at the timing of the falling of the clock signal CK1 and the rising of the clock signal CK2.

Next, the clocked inverter CIV12 operates at the timing of the rising of the clock signal CK1 and the falling of the clock signal CK2, so that the latch LTC11 latches the output signal VCO. Then, the latched signal is transferred to the latch LTC12 via the clocked inverter CIV11.

Next, the clocked inverter CIV13 operates at the timing of the falling of the clock signal CK1 and the rising of the clock signal CK2, so that the latch LTC12 latches the transferred signal VCO.

The latched signal at the node ND14 is supplied to the one input terminal of the NAND gate NA131.

In this manner, the FF 131 fetches and latches the output signal VCO of the comparator 11 in synchronism with the falling edge of the clock signal.

The FF 132 has a transfer gate TM21 at an input stage, a latch LTC21, a clocked inverter CIV21, a latch LTC22, and nodes ND21 to ND14.

The latch LTC21 is formed by an inverter INV21 and a clocked inverter CIV22.

The latch LTC22 is formed by an inverter INV22 and a clocked inverter CIV21.

The transfer gate TM21 is formed by coupling the sources and drains of a PMOS transistor and an NMOS transistor together. The clock signal CK1 is supplied to the gate of the NMOS transistor, and the clock signal CK2 is supplied to the gate of the PMOS transistor.

The transfer gate TM21 has one input/output terminal connected to a supply line for the output signal VCO of the comparator 11, and the other input/output terminal connected to the node ND21.

In the latch LTC21, the inverter INV21 has an input terminal connected to the node ND21, and an output terminal connected to the node ND22. A clocked inverter CIV22 has an input terminal connected to the node ND22, and an output terminal connected to the node ND21.

The clocked inverter CIV22 is supplied with the clock signal CK1 at its negative clock terminal and the clock signal CK2 at its positive clock terminal.

The clocked inverter CIV21 has an input terminal connected to the node ND22, and an output terminal connected to the node ND23.

The clocked inverter CIV21 is supplied with the clock signal CK1 at its negative clock terminal and the clock signal CK2 at its positive clock terminal.

In the latch LTC22, the inverter INV22 has an input terminal connected to the node ND23, and an output terminal connected to the node ND24. A clocked inverter CIV23 has an input terminal connected to the node. ND24, and an output terminal connected to the node ND23.

The clocked inverter CIV23 is supplied with the clock signal CK1 at its positive clock terminal and the clock signal CK2 at its negative clock terminal.

The node ND24 as the output node of the latch LTC22 is connected to the other input terminal of the NAND gate NA231.

The FF 132 with the foregoing configuration latches the output signal VCO of the comparator 11 into the latch LTC21 at the timing of the rising of the clock signal CK1 and the falling of the clock signal CK2.

Next, the clocked inverter CIV22 operates at the timing of the falling of the clock signal CK1 and the rising of the clock signal CK2, so that the latch LTC21 latches the output signal VCO. Then, the latched signal is transferred to the latch LTC22 via the clocked inverter CIV21.

Next, the clocked inverter CIV23 operates at the timing of the rising of the clock signal CK1 and the falling of the clock signal CK2, so that the latch LTC22 latches the transferred signal VCO.

The latched signal at the node ND24 is supplied to the other input terminal of the NAND gate NA231.

The FF 132 fetches and latches the output signal VCO of the comparator 11 in synchronism with the rising edge of the clock signal.

As apparent from the above, the synchronization circuit 131 is configured in such a way that the output signal VCO of the comparator 11 is input to the two FFs 131 and 132 which latch the output signal VCO at the opposite edges of the main clock signal CLKA.

The output signal VCO of the comparator 11 and the main clock signal CLKA are input to the synchronization circuit 131, and the output signal VCO is synchronized at both of the rising edge and the falling edge of the main clock signal CLKA.

The synchronized signal is output as the count operation start signal VCO_SYNC by which the high-bit counter 12 is triggered to start the count operation.

By inserting a delay element therein the count operation start signal VCO_SYNC is input as a latch timing signal VCO_SYNCD to the latch for the main clock signal CLKA in the low-bit TDC 14.

The TDC 14 basically latches phase information at the timing at which the output signal VCO of the comparator 11 is inverted using a plurality of clock signals including the main clock signals CLKA of different phases, and decodes the latched value to output lower bits having a higher resolution than the clock cycle.

In the embodiment, clock signals CLKA, CLKB, CLKC and CLKD whose phases are shifted from one another by 45 degrees with the main clock signal CLKA taken as the reference are used as a plurality of clock signals of different phases.

Figure 7:
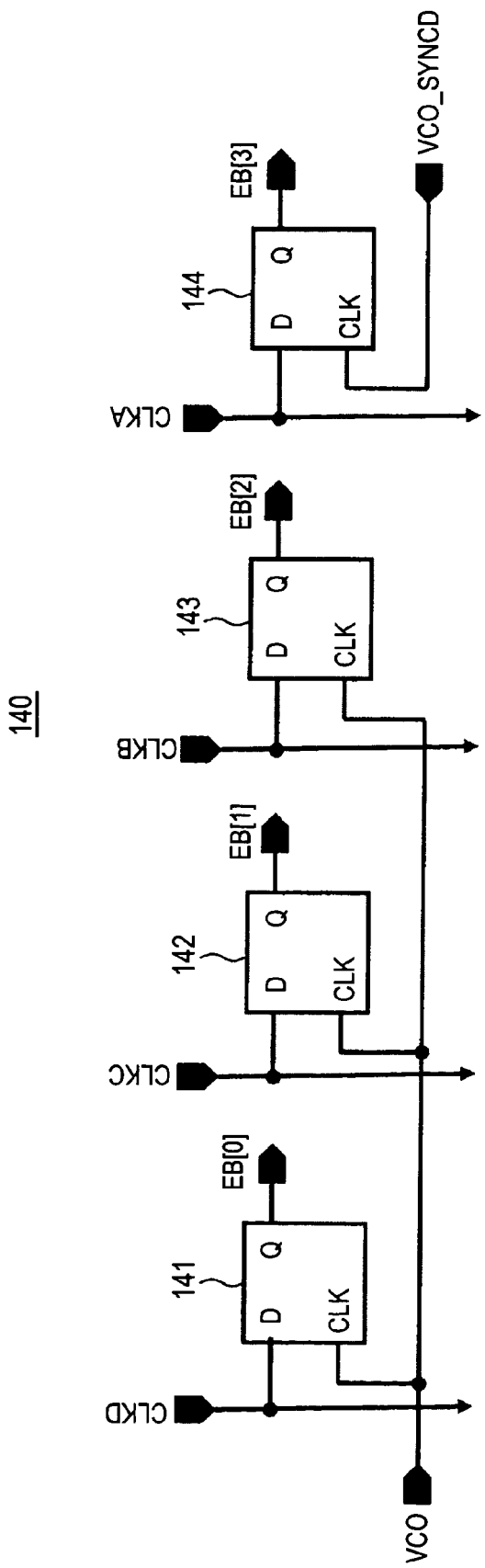
FIG. 7 is a circuit diagram showing a configurational example of a latch section in a TDC (time quantizer) according to the embodiment.

FIG. 7 is a circuit diagram showing a configurational example of a latch section in the TDC (time quantizer) according to the embodiment.

A latch section 140 in the TDC 14 in FIG. 6 has FFs 141, 142 and 143 as a first latch, and an FF 144 as a second latch.

Each of the FFs 141, 142 and 143 as the first latch latches phase information of the clock signal CLKB, CLKC, CLKD, excluding the main clock signal CLKA, in synchronism with the output signal VCO of the comparator 11.

The FF 141 latches the phase information of the clock signal CLKD in synchronism with the output signal VCO of the comparator 11. An extending code EB [0] is acquired from the Q output of the FF 141.

The FF 142 latches the phase information of the clock signal CLKC in synchronism with the output signal VCO of the comparator 11. An extending code EB [1] is acquired from the Q output of the FF 142.

The FF 143 latches the phase information of the clock signal CLKB in synchronism with the output signal. VCO of the comparator 11. An extending code EB [2] is acquired from the Q output of the FF 143.

The FF 144 latches the phase information of the main clock signal CLKA in synchronism with the latch timing signal VCO_SYNCD generated by the regulating unit 13. An extending code EB [3] is acquired from the Q output of the FF 144.

The FF 144 as the second latch outputs a value which is the inverted logic value of the main clock signal CLKA.

Figure 8:
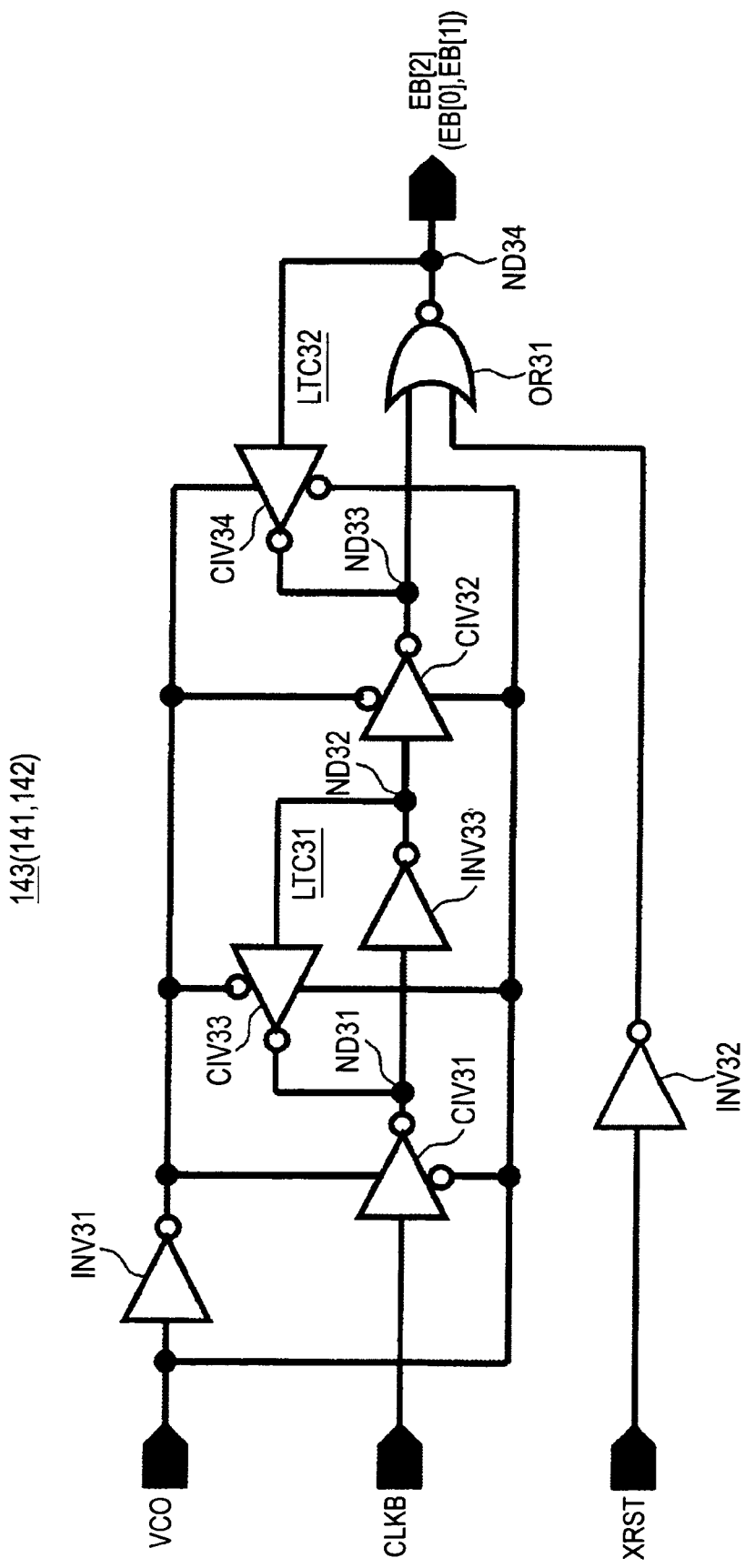
FIG. 8 is a circuit diagram showing a specific configurational example of a flip-flop (FF) as a first latch in the TDC (time quantizer) according to the embodiment.

FIG. 8 is a circuit diagram showing a specific configurational example of the FF as the first latch in the TDC (time quantizer) according to the embodiment.

FIG. 8 is a circuit diagram of the gate levels of the FFs 141 to 143 as the first latch.

Although the configuration of the FF 143 is exemplified in FIG. 8, the FF 141 and FF142 have the same configuration as that of the FF 143.

The FF 143 has inverters INV31, INV32, clocked inverters CIV31, CIV32, latches LTC31, LTC32, a NOR gate NR31, and nodes ND31 to ND34.

The latch LTC31 is formed by an inverter INV33 and a clocked inverter CIV33.

The latch LTC32 is formed by the NOR gate NR31 and a clocked inverter CIV34.

The inverter INV31 has an input terminal connected to a supply line for the output signal VCO of the comparator 11.

The clocked inverter CIV31 has an input terminal connected to a supply line for the clock signal CLKB, and an output terminal connected to the node ND31.

The clocked inverter CIV31 is supplied with the inverted signal of the output signal VCO of the comparator 11 at its positive clock terminal and the output signal VCO at its negative clock terminal.

In the latch LTC31, the inverter INV33 has an input terminal connected to the node ND31, and an output terminal connected to the node ND32. The clocked inverter CIV33 has an input terminal connected to the node ND32, and an output terminal connected to the node ND31.

The clocked inverter CIV33 is supplied with the inverted signal of the output signal VCO of the comparator 11 at its negative clock terminal and the output signal VCO at its positive clock terminal.

The clocked inverter CIV32 has an input terminal connected to the node ND32, and an output terminal connected to the node ND33.

The clocked inverter CIV32 is supplied with the inverted signal of the output signal VCO of the comparator 11 at its negative clock terminal and the output signal VCO at its positive clock terminal.

In the latch LTC32, the NOR gate NR31 has one input terminal connected to the node ND33, and an output terminal connected to the node ND34. The clocked inverter CIV34 has an input terminal connected to the node ND34, and an output terminal connected to the node ND33.

The clocked inverter CIV34 is supplied with the inverted signal of the output signal VCO of the comparator 11 at its positive clock terminal and the output signal VCO at its negative clock terminal.

The other input terminal of the NOR gate NR31 is connected to the input terminal of the inverter INV32. The input terminal of the inverter INV32 is connected to a supply line for a reset signal XRST.

The FF 143 with the foregoing configuration latches the clock signal CLKB into the latch LTC31 at the timing of the falling of the output signal VCO of the comparator 11.

Next, the clocked inverter CIV33 operates at the timing of the rising of the output signal VCO, so that the latch LTC31 latches the clock signal CLKB. Then, the latched signal is transferred to the latch LTC32 via the clocked inverter CIV31.

Next, the clocked inverter CIV34 operates at the timing of the falling of the output signal VCO, so that the latch LTC32 latches the transferred clock signal CLKB.

Then, the latched signal at the node ND34 is output as an extending code EB [2].

In this manner, the FF 143 (141, 142) in FIG. 8 latches the phase information of the clock signal CLKB, CLKC, CLKD, and outputs an extending code EB [2:0].

The latch timing signal for the FF 143 (141, 142) is the output signal VCO of the comparator 11, and the FF 143 (141, 142) latches and outputs the value of the clock signal CLKB, CLKC, CLKD directly.

Figure 9:
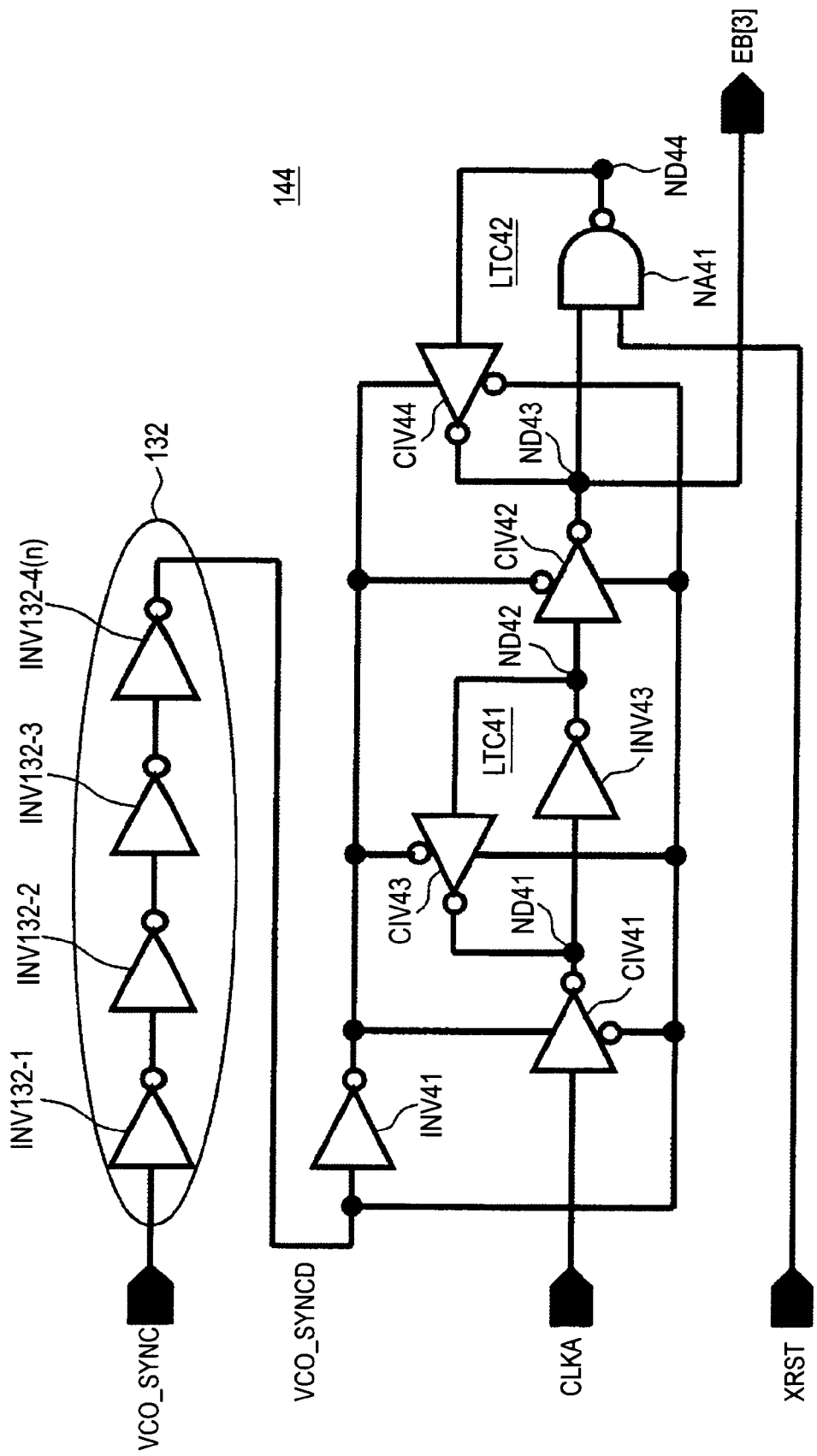
FIG. 9 is a circuit diagram showing specific configurational examples of a delay unit in the regulating unit and the FF as a first latch in the TDC (time quantizer) according to the embodiment.

FIG. 9 is a circuit diagram showing specific configurational examples of the delay unit in the regulating unit and the FF as the first latch in the TDC (time quantizer) according to the embodiment.

FIG. 9 is a circuit diagram of the gate levels of the delay unit and the FF 144 as the second latch.

The delay unit 132 of the regulating unit 13 is formed by, for example, an inverter chain of inverters INV132-1 to INV132-n (n=4 in the example of FIG. 9) as delay elements connected in series, as shown in FIG. 9.

The delay unit 132 delays the count operation start signal VCO_SYNC output from the synchronization circuit 131 by a predetermined time, and supplies the delayed signal as the latch timing signal VCO_SYNCD to the FF 144 of the TDC 14.

The FF 144 has an inverter INV41, clocked inverters. CIV41, CIV42, latches LTC41, LTC42, a NAND gate NA41, and nodes ND41 to ND44.

The latch LTC41 is formed by an inverter INV42 and a clocked inverter CIV43.

The latch LTC42 is formed by the NAND gate NA41 and a clocked inverter CIV44.

The inverter INV41 has an input terminal connected to a supply line for the latch timing signal VCO_SYNCD.

The clocked inverter CIV41 has an input terminal connected to a supply line for the main clock signal CLKA, and an output terminal connected to the node ND41.

The clocked inverter CIV41 is supplied with the inverted signal of the latch timing signal VCO_SYNCD at its positive clock terminal and the latch timing signal VCO_SYNCD at its negative clock terminal.

In the latch LTC41, the inverter INV42 has an input terminal connected to the node ND41, and an output terminal connected to the node ND42. The clocked inverter CIV43 has an input terminal connected to the node ND42, and an output terminal connected to the node ND41.

The clocked inverter CIV43 is supplied with the inverted signal of the latch timing signal VCO_SYNCD at its negative clock terminal and the latch timing signal VCO_SYNOD at its positive clock terminal.

The clocked inverter CIV42 has an input terminal connected to the node ND42, and an output terminal connected to the node ND43.

The clocked inverter CIV42 is supplied with the inverted signal of the latch timing signal VCO_SYNCD at its negative clock terminal and the latch timing signal VCO_SYNCD at its positive clock terminal.

In the latch LTC42, the NAND gate NA41 has one input terminal connected to the node ND43, and an output terminal connected to the node ND44. The clocked inverter CIV44 has an input terminal connected to the node ND44, and an output terminal connected to the node ND43.

The clocked inverter CIV44 is supplied with the inverted signal of the latch timing signal VCO_SYNCD at its positive clock terminal and the latch timing signal VCO_SYNCD at its negative clock terminal.

The other input terminal of the NAND gate NA41 is connected to a supply line for the reset signal XRST.

The FF 144 with the foregoing configuration latches the main clock signal CLKA into the latch LTC41 at the timing of the falling of the latch timing signal VCO_SYNCD.

Next, the clocked inverter CIV43 operates at the timing of the rising of the latch timing signal VCO_SYNCD, so that the latch LTC41 latches the main clock signal CLKA. Then, the latched signal is transferred to the latch LTC42 via the clocked inverter CIV41.

Next, the clocked inverter CIV44 operates at the timing of the falling of the latch timing signal VCO_SYNCD, so that the latch LTC42 latches the transferred main clock signal CLKA.

Then, the latched signal at the node ND43 is output as an extending code EB [3].

In this manner, the FF 144 latches the phase information of the main clock signal CLKA, and outputs an extending code EB [3].

The latch timing signal VCO_SYNCD is generated by delaying the count operation start signal VCO_SYNC using the delay unit 132 like the inverter chain.

The value to be stored and the actual value to be latched of the extending code EB [3] become opposite to each other, so that the output of the extending code EB [3] is the inverted logic value of the main clock signal CLKA.

The integrated AD converter 10 with the foregoing configuration has a feature of preventing a sparkle error from occurring at the joint portion of the high-bit counter 12 and the low-bit TDC 14.

The principle of how the integrated AD converter 10 according to the embodiment prevents a sparkle error will be described below referring to FIGS. 10 and 11.

Figure 10:
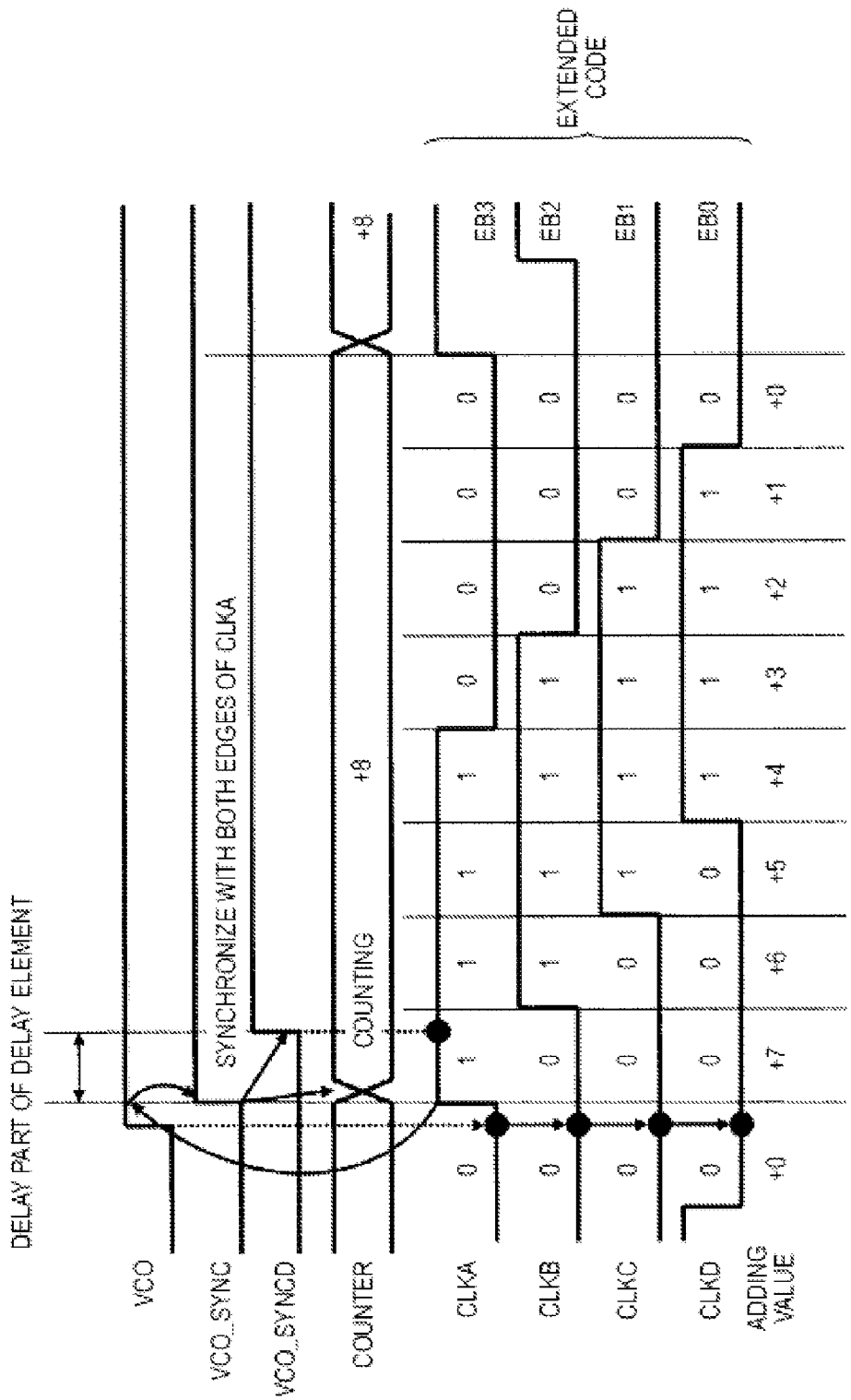
FIG. 10 is a diagram for explaining the principle of preventing a sparkle error according to the embodiment, showing a case where an output signal VCO of a comparator changes slightly before the rising edge of a main clock signal CLKA.
Figure 11:
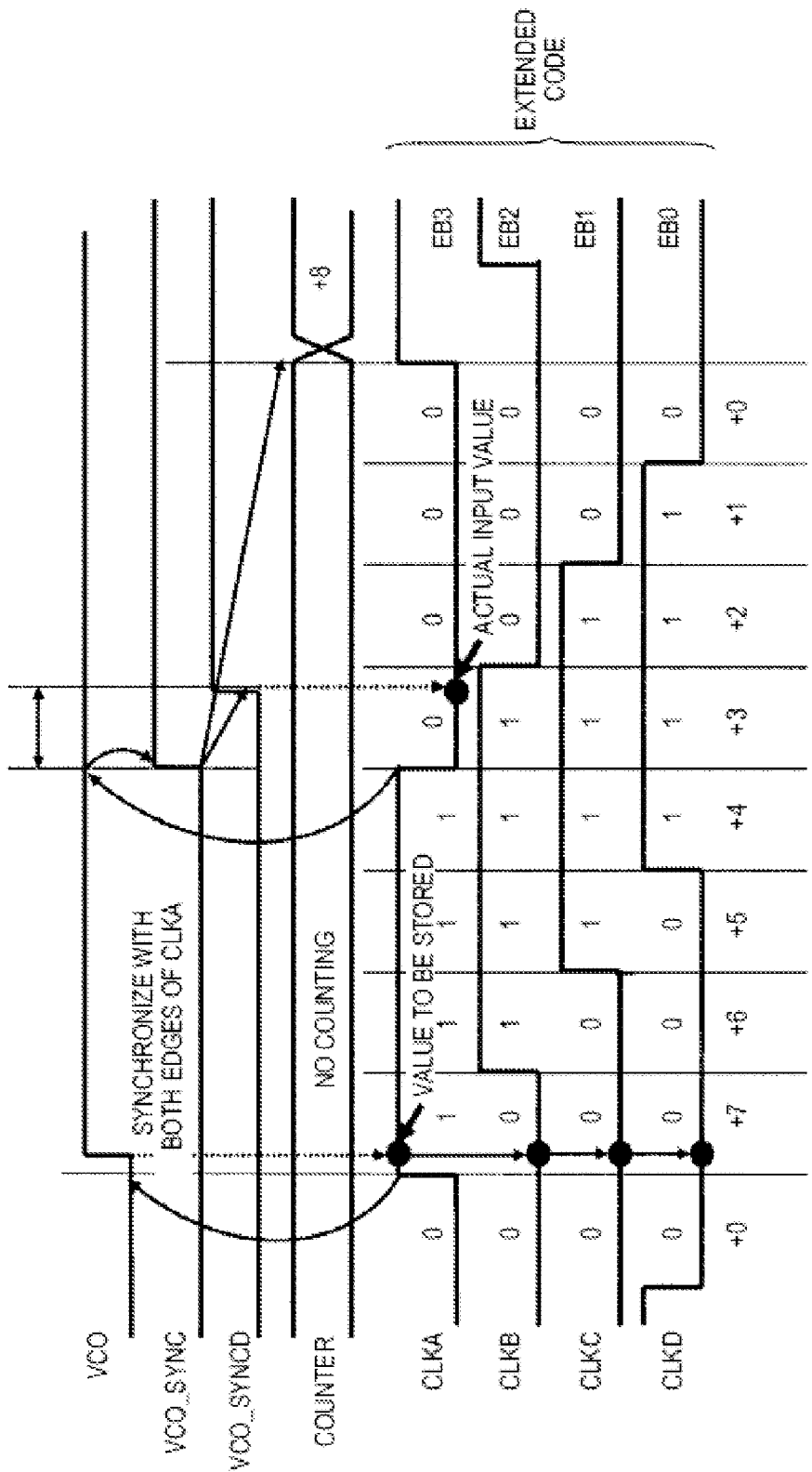
FIG. 11 is a diagram for explaining the principle of preventing a sparkle error according to the embodiment in a case where the output signal VCO of the comparator changes slightly after the rising edge of the main clock signal CLKA.

FIGS. 10 and 11 are diagrams for explaining the principle of how the integrated AD converter 10 according to the embodiment prevents a sparkle error.

FIG. 10 shows a case where the output signal VCO of the comparator changes slightly before the rising edge of the main clock signal CLKA.

Since [000b] should be stored as the extending code EB [2:0] regardless of before or after the edge of the main clock signal CLKA, the output signal VCO of the comparator 11 is latched directly at the timing of its change.

The output signal VCO is synchronized at the rising edge of the main clock signal CLKA.

In this case, since the output signal VCO changes slightly before the rising edge of the main clock signal CLKA, the synchronization causes the count operation start signal VCO_SYNC as the output of the synchronization circuit 131 to rise.

Since counting higher bits starts when triggered by the rising of the output signal VCO_SYNC, counting is implemented at the rising of the main clock signal CLKA.

In addition, [1b] is latched as the extending code EB [3] in response to the signal VCO_SYNCD which is the delayed signal VCO_SYNC.

FIG. 11 is a diagram for explaining the principle of preventing a sparkle error in a case where the output signal VCO of the comparator changes slightly after the rising edge of the main clock signal CLKA.

Since [000b] should likewise be stored as the extending code EB [2:0] regardless of before or after the edge of the main clock signal CLKA, the output signal VCO of the comparator 11 is latched directly at the timing of its change.

The output signal VCO is synchronized at the rising edge of the main clock signal CLKA, in which case the output signal VCO changes slightly after the rising edge of the main clock signal CLKA, so that the synchronization does not cause the count operation start signal VCO_SYNC as the output signal of the synchronization circuit 131 to rise.

The synchronization of the output signal VCO_SYNC at the next falling edge of the main clock signal CLKA causing the counting operation to start at the next rising edge of the main clock signal CLKA.

Since the output signal VCO_SYNC is synchronized at the falling of the main clock signal CLKA at this time, [0b] is latched as the extending code EB [3] in response to the latch timing signal VCO_SYNCD which is the delayed output signal VCO_SYNC.

The value to be stored and the actual value to be latched of the extending code EB [3] become opposite to each other.

In this respect, only the FF 144 which latches the phase information of the main clock signal CLKA is configured to output the inverted value of the input to the extending code EB [3].

The key point of the embodiment lies in that the timing of starting the counting operation of the high-bit counter 12 is associated with the dependency of the value to be stored in the low-bit TDC 14 by the synchronization circuit 131.

That is, information on whether the output signal VCO of the comparator 11 changes around the edge of the main clock signal CLKA is obtained.

Based on the result of the acquisition, the timing of starting the counting operation of the high-bit counter 12 and the value to be stored in the low-bit TDC 14 are both determined, so that a sparkle error does not occur at the joint portion of the high-bit counter 12 and the low-bit TDC 14.

As described above, the integrated AD converter according to the first embodiment prevents a sparkle error from occurring at the joint portion of the higher bits and the lower bits in principle, thereby improving the INL/DNL characteristics of the AD converter.

Further, the synchronization circuit is mounted in an ordinary AD counter which uses both a fast clock and a slow clock to reduce power consumption, so that the hardware hardly needs to be increased.

<2. Second Embodiment>

[Example of General Configuration of Solid State Imaging Device]

Figure 12:
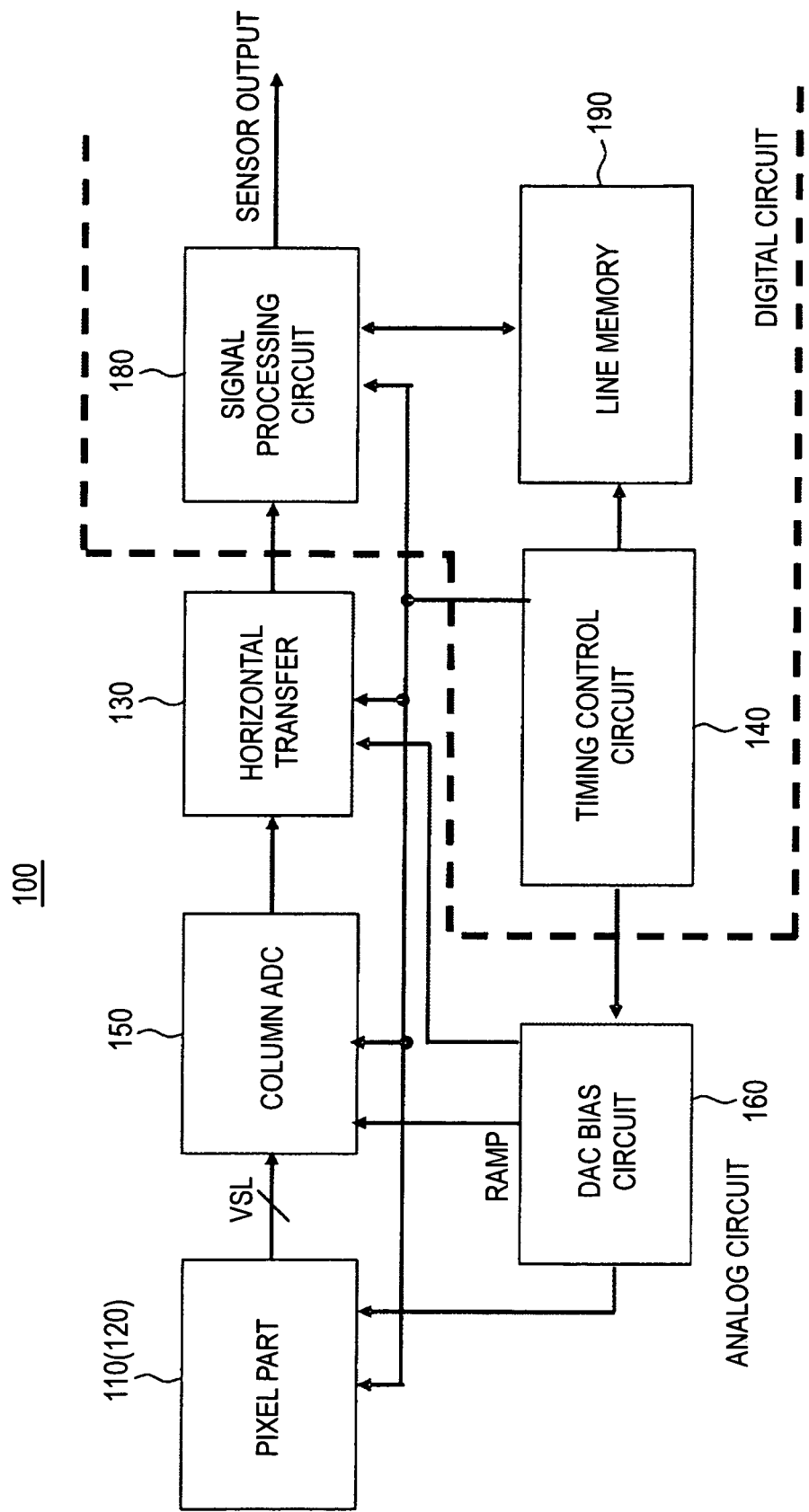
FIG. 12 is a block diagram showing a configurational example of a solid state imaging device (CMOS image sensor) having a column parallel ADC according to a second embodiment of the invention.

FIG. 12 is a block diagram showing a configurational example of a column parallel ADC mounted solid state imaging device (CMOS image sensor) 100 according to a second embodiment of the invention.

Figure 13:
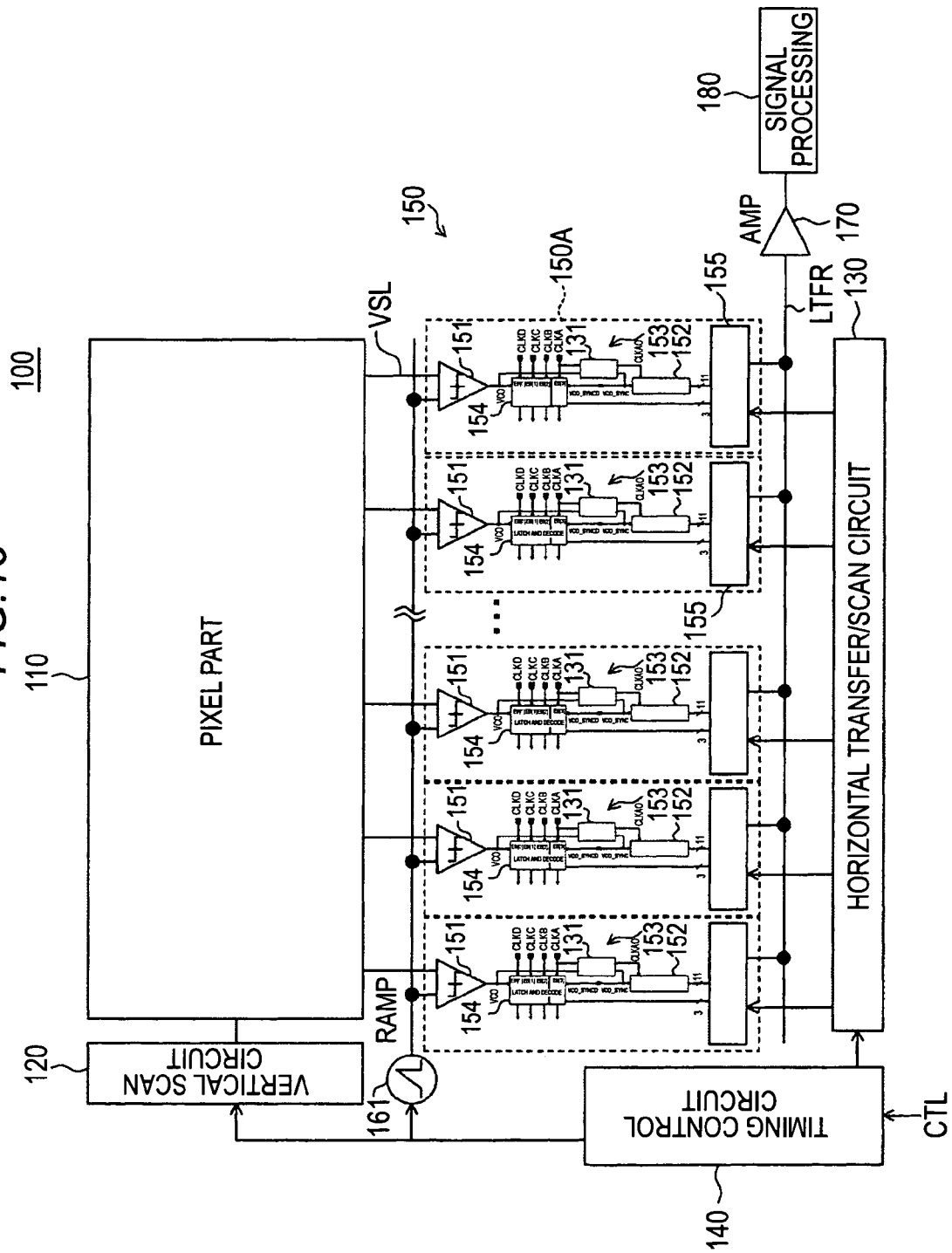
FIG. 13 is a block diagram more specifically showing ADCs in the column parallel ADC mounted solid state imaging device (CMOS image sensor) in FIG. 12.

FIG. 13 is a block diagram more specifically showing ADCs in the column parallel ADC mounted solid state imaging device (CMOS image sensor) 100 in FIG. 12.

As shown in FIGS. 12 and 13, the solid state imaging device 100 has a pixel part 110 as an imaging part, a vertical scan circuit 120, a horizontal transfer/scan circuit 130, a timing control circuit 140, and an AD converter (ADC) group 150 as a pixel signal reading part. The pixel signal reading part includes the vertical scan circuit 120.

The solid state imaging device 100 further has a DAC bias circuit 160 including a DA (digital-to-analog) converter 161, an amplifier circuit (S/A) 170, a signal processing circuit 180, and a line memory 190.

Of those components, the pixel part 110, the vertical scan circuit 120, the horizontal transfer/scan circuit 130, the ADC group 150, the DAC bias circuit 160, and the amplifier circuit (S/A) 170 are each constituted by an analog circuit.

The timing control circuit 140, the signal processing circuit 180, and the line memory 190 are each constituted by a digital circuit.

The pixel part 110 has a matrix array of pixels each including a photodiode and an intrapixel amplifier.

Figure 14:
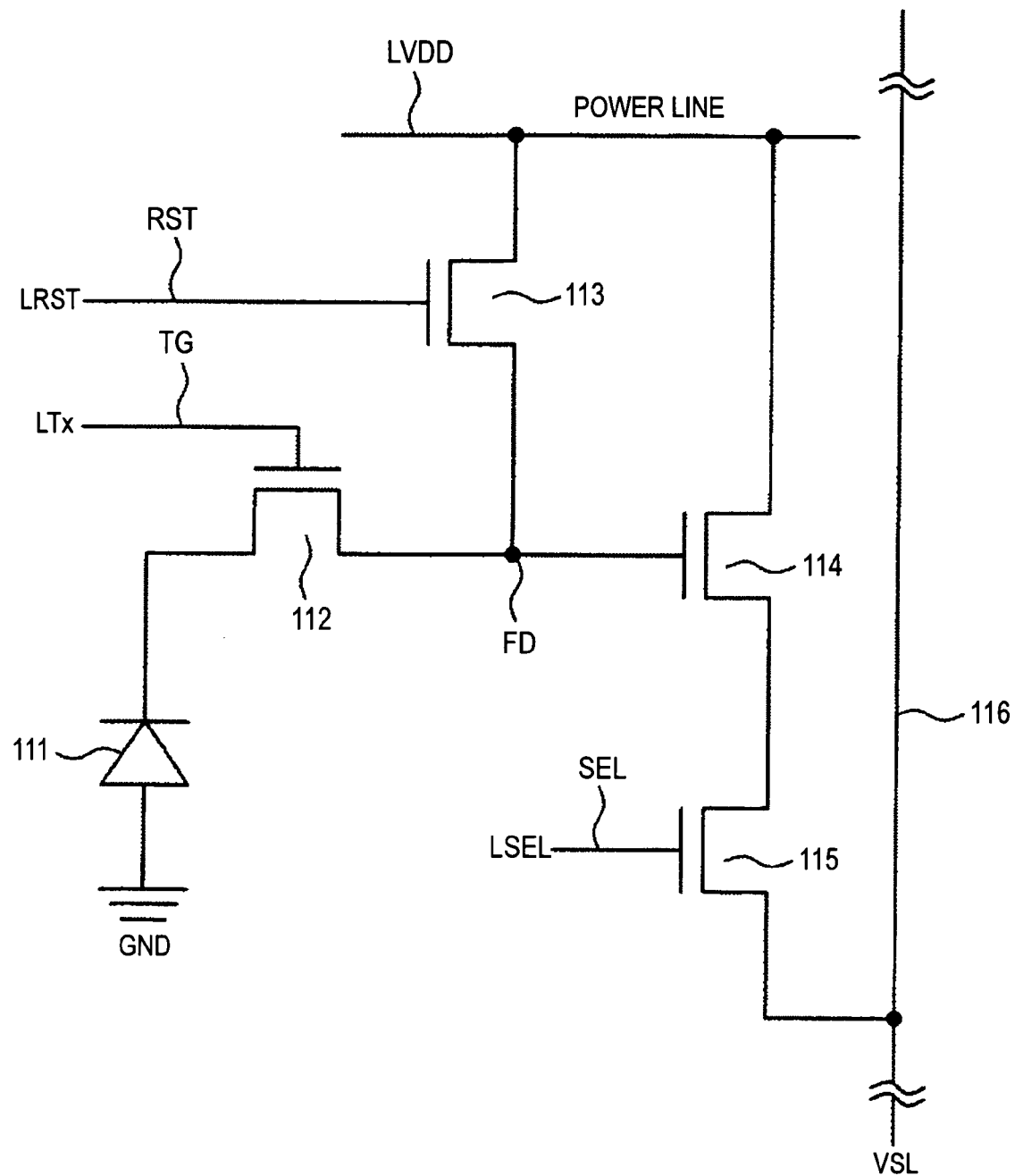
FIG. 14 is a diagram showing an example of a pixel in a CMOS image sensor having four transistors according to the second embodiment.

FIG. 14 is a diagram showing an example of a pixel in the CMOS image sensor having four transistors according to the second embodiment.

A pixel circuit 101A has a photodiode 111 as a single photoelectric converter.

The pixel circuit 101A has four transistors, namely, a transfer transistor 112 as a transfer element, a reset transistor 113 as a reset element, an amplification transistor 114, and a selection transistor 115, as active elements for the single photodiode 111.

The photodiode 111 photoelectrically converts input light to charges (electrons in this example) according to the quantity of the light.

The transfer transistor 112 is connected between the photodiode 111 and a floating diffusion FD as an output node.

When a drive signal TG is supplied to the gate (transfer gate) of the transfer transistor 112 via a transfer control line LTx, the transfer transistor 112 transfers the electrons, photoelectrically converted by the photodiode 111, to the floating diffusion FD.

The reset transistor 113 is connected between a power line LVDD and the floating diffusion FD.

When a reset signal RST is supplied to the gate of the reset transistor 113 via a reset control line LRST, the reset transistor 113 resets the potential of the floating diffusion FD to the potential of the power line LVDD.

The gate of the amplification transistor 114 is connected to the floating diffusion FD. The amplification transistor 114 is connected to the vertical signal line 116 via the selection transistor 115 to thereby form a source follower together with a constant current source provided outside the pixel part.

A control signal (address signal or select signal) SEL is supplied to the gate of the selection transistor 115 via a selection control line LSEL to turn on the selection transistor 115.

When the selection transistor 115 is turned on, the amplification transistor 114 amplifies the potential of the floating diffusion FD, and outputs a voltage corresponding to the potential to the vertical signal line 116. Voltages output from the individual pixels are output to the ADC group 150 as the pixel signal reading circuit via the vertical signal line 116.

Because the gates of the transfer transistor 112, the reset transistor 113 and the selection transistor 115 are connected to row by row, those operations are performed simultaneously for one row of pixels.

The reset control line LRST, the transfer control line LTx and the selection control line LSEL, which are laid out in the pixel part 110, are laid out as a set for each row of the matrix of pixels.

The reset control line LRST, the transfer control line LTx and the selection control line LSEL are driven by the vertical scan circuit 120 as a pixel drive part.

The solid state imaging device 100 is provided with the timing control circuit 140 which generates an internal clock, the vertical scan circuit 120 which controls row addresses and row scanning, and the horizontal transfer/scan circuit 130 which controls column addresses and column scanning, as a control circuit for sequentially reading signals from the pixel part 110.

The timing control circuit 140 generates timing signals needed for signal processings in the pixel part 110, the vertical scan circuit 120, the horizontal transfer/scan circuit 130, the AD converter group (ADC group) 150, the DAC bias circuit 160, the signal processing circuit 180, and the line memory 190.

In the pixel part 110, a video image or a screen image is photoelectrically converted for each row of pixels through storage and discharge of photons by using a column shutter, for example, and outputs analog signals VSL to the ADC group 150.

In the ADC group 150, each ADC block (each column part) performs integrated ADC compatible with APGA and digital CDS on the analog output of the pixel part 110 using a reference voltage RAMP output from the DA converter (DAC) 161, and outputs a digital signal of several bits.

Figure 15:
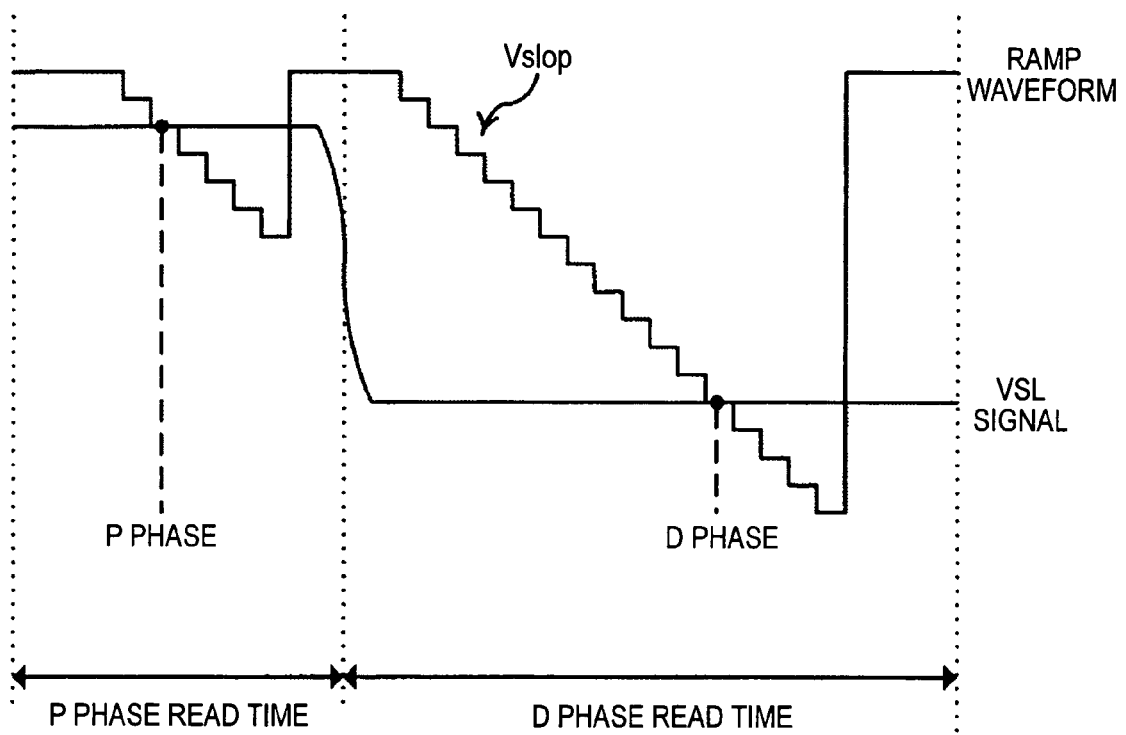
FIG. 15 is a diagram showing an example of a ramp waveform generated by a DA converter in FIG. 12, and the operation timing of the ADC in FIG. 13.

FIG. 15 is a diagram showing an example of a ramp waveform generated by the DAC in FIG. 12, and the operation timing of the ADC in FIG. 13.

The ADC group 150 includes the integrated AD converters shown FIG. 5 arranged in plural columns.

The DAC 161 generates the reference voltage PAMP with the ramp waveform which inclines stepwise as shown FIG. 14.

Each integrated AD converter 150A has a comparator 151, a high-bit counter 152, a regulating unit 153, a TDC (time-to-Digital Converter; time quantizer) 154, and a logic circuit 155.

Because the comparator 151, the high-bit counter 152, the regulating unit 153, and the TDC 154 have the same functions as those of the comparator 11, the high-bit counter 12, the regulating unit 13 and the TDC 14 in FIG. 10, their detail descriptions will be omitted.

The logic circuit 155 adds lower bits (e.g., 3 bits) generated by the low-bit TDC 154 to higher bits (e.g., 11 bits) generated by the high-bit counter 152 to connect the bits together.

The feature of the integrated AD converter 150A lies in prevention of a sparkle error from occurring at the joint portion.

The output of each logic circuit 155 is connected to a horizontal transfer line LTRF.

k amplifier circuits 170 and the signal processing circuits 180, which correspond to the horizontal transfer line LTRF, are laid out.

After the above AD conversion cycle ends, the horizontal transfer/scan circuit 130 allows data from the logic circuit 155 to be transferred to the horizontal transfer line LTRF, and input to the signal processing circuit 180 via the amplifier circuit 170, and is subjected to predetermined signal processings to generate a two-dimensional image.

The horizontal transfer/scan circuit 130 simultaneously performs parallel transfers for several channels to secure the transfer rate.

The timing control circuit 140 generates timing signals needed for signal processings in the individual blocks, such as the pixel part 110 and the ADC group 150.

The signal processing circuit 180 at the subsequent stage performs correction of defects of vertical lines and point defects, signal clamping, and digital signal processings, such as parallel-serial conversion, compression, encoding, addition, averaging, and an intermittent operation, based on signals stored in the line memory 190.

Digital signals to be transmitted for each row of pixels are stored in the line memory 190.

In the solid state imaging device 100 according to the embodiment, the digital output of the signal processing circuit 180 is transmitted as an input to an ISP (Image Signal Processor) or a base band LSI.

The operation of the foregoing configuration will be described below.

The DAC 161 generates the reference voltage RAMP.

In each integrated AD converter 150A, the comparator 151 disposed for each column compares an analog signal potential VSL read onto the vertical signal line 116 with the reference voltage RAMP which changes stepwise.

The comparator 151 outputs a signal VCO with a level corresponding to the comparison result to the regulating unit 153 and the TDC 154.

The regulating unit 153 synchronizes the output signal VCO of the comparator 151 with the main clock signal CLKA. Using the signal resulting from the synchronization, the regulating unit 153 determines the timings of starting and stopping the operation of the high-bit counter 152 and a value for latching the phase information of the main clock signal CLKA.

Specifically, the regulating unit 153 synchronizes the output signal VCO of the comparator 151 at both of the rising edge and the falling edge of the main clock signal CLKA, and outputs the synchronized signal as a count operation start signal VCO_SYNC.

Based on the count operation start signal VCO_SYNC, the regulating unit 153 generates a latch timing signal VCO_SYNCD for latching the phase information of the main clock signal CLKA. The generated latch timing signal VCO_SYNCD is supplied to the TDC 154.

The high-bit counter 152 is basically triggered by the inversion of the output signal VCO of the comparator 151 to start or stop the count operation to count for each cycle of the main clock signal CLKA.

The high-bit counter 152 is triggered by the count operation start signal VCO_SYNC generated by synchronizing the output signal VCO of the comparator 151 with the main clock signal CLKA by the regulating unit 153 to count the main clock signal CLKAO via the regulating unit 153 for every cycle.

Using a plurality of clock signals CLKA to CLKD including main clock signals CLKA of different phases, the TDC 154 latches phase information at the timing at which the output signal VCO of the comparator 151 is inverted. Then, the TDC 154 decodes the latched value, and outputs lower bits having a higher resolution than the clock cycle.

The logic circuit 155 connects higher bits (e.g., 11 bits) generated by the high-bit counter 152 to lower bits (e.g., 3 bits) generated by the low-bit TDC 154 together.

In this case, the integrated AD converter 150A prevents a sparkle error from occurring at the joint portion.

This completes the AD conversion.

The converted digital signals are read into the amplifier circuit 170 via the horizontal transfer line LTRF in order by, for example, the horizontal (column) transfer/scan circuit 130, and are output finally.

The column parallel output process is carried out in the above manner.

The CMOS image sensor 100 as the solid state imaging device according to the second embodiment adopts the integrated AD converter (ADC) 10 in FIG. 5.

Therefore, the solid state imaging device can enhance the INL/DNL characteristics of the AD converter by preventing a sparkle error from occurring at the joint portion of the higher bits and the lower bits in principle.

In addition, the synchronization circuit is mounted in an ordinary AD counter which uses both a fast clock and a slow clock to reduce power consumption, so that the hardware hardly needs to be increased.

The solid state imaging device that has the above advantage can be adapted as an imaging device for a digital camera or a video camera.

<3. Third Embodiment>
[Configurational Example of Camera System]

Figure 16:
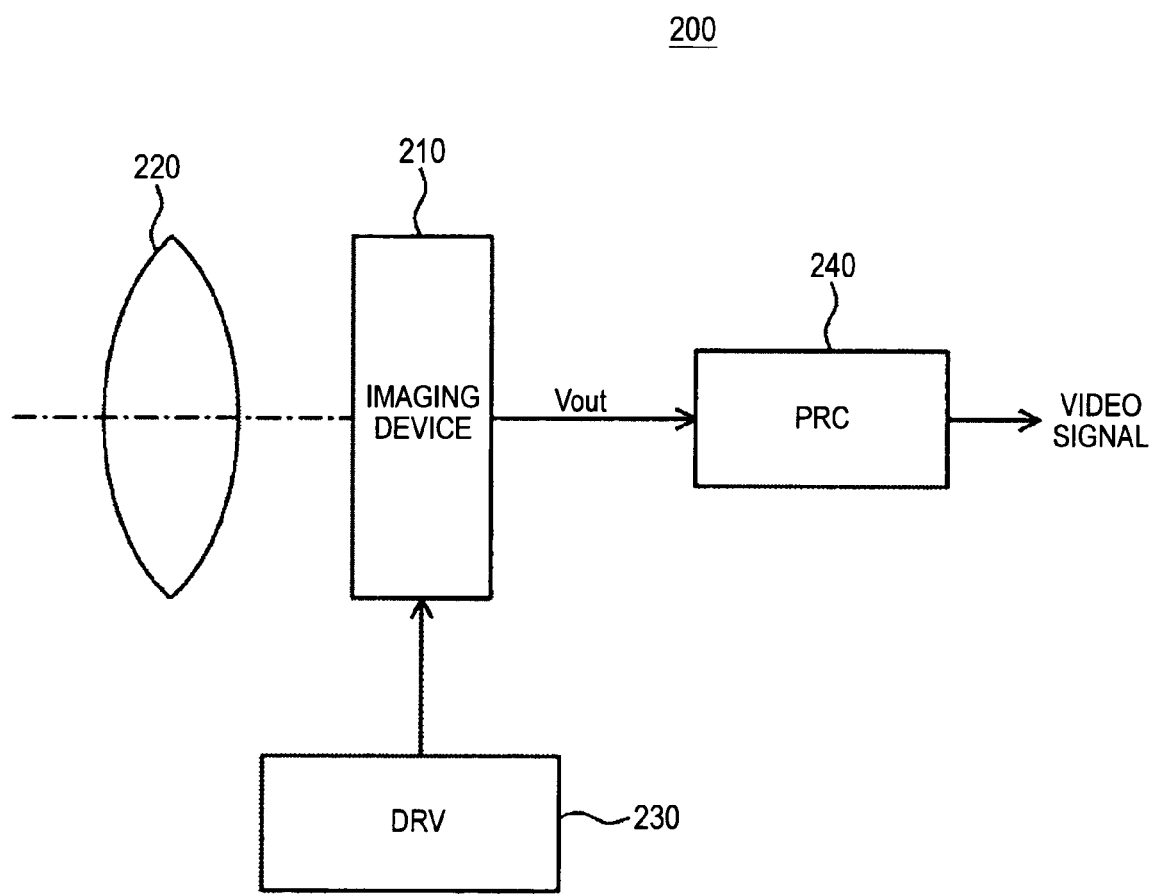
FIG. 16 is a diagram showing an example of the configuration of a camera system to which the solid state imaging device according to the embodiment of the invention is adapted.

FIG. 16 is a diagram showing an example of the configuration of a camera system 200 to which the solid state imaging device according to the embodiment of the invention is adapted.

As shown in FIG. 16, the camera system 200 has an imaging device 210 to which the solid state imaging device 100 according to the embodiment is adaptable.

The camera system 200 has a lens 220 which focuses, for example, input light (image light) on an imaging surface, as an optical system which guides the input light to (forms a subject image on) the pixel area of the imaging device 210.

The camera system 200 further has a drive circuit (DRV) 230 which drives the imaging device 210, and a signal processing circuit (PRC) 240 which processes the output signal of the imaging device 210.

The drive circuit 230 has a timing generator (not shown) to generate various timing signals including a start pulse and a clock pulse for driving internal circuits of the imaging device 210. The drive circuit 230 drives the imaging device 210 by a predetermined timing signal.

The signal processing circuit 240 performs predetermined signal processing on the output signal of the imaging device 210.

Image signals processed by the signal processing circuit 240 are recorded in a recording medium, such as a memory. A hard copy of image information recorded in the recording medium is provided by a printer or the like. In addition, the image signals processed by the signal processing circuit 240 are displayed as a moving image on a monitor having a liquid crystal display or the like.

As described above, the above-described solid state imaging device 100 can be mounted as the imaging device 210 in an imaging apparatus, such as a digital still camera, to realize a high-definition camera.

The present application contains subject matter related to that disclosed in Japanese Priority Patent Application JP 2009-107105 filed in the Japan Patent Office on Apr. 24, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An integrated AD (analog-to-digital) converter comprising:
 a comparator that compares an input voltage with a reference voltage with a ramp waveform whose voltage value linearly changes with time;
 a high-bit counter that is triggered by inversion of an output signal of the comparator to start or stop an operation of counting, wherein the counting operation, after being started, counts once for every cycle of a main clock signal until stopped;
 a time quantizer that latches phase information of a plurality of clock signals, including the main clock signal, each clock signal having the same period as the main clock signal and having non-zero phase differences relative to each of the other clock signals, wherein the time quantizer latches the phase information at a timing at which the output signal of the comparator is inverted, and decodes a value of the latched phase information to thereby output bits with a resolution higher than a clock cycle of the main clock signal; and
 a regulating unit that synchronizes the output signal of the comparator with the main clock signal, and determines timings of starting and stopping the counting operation of the high-bit counter and a value for latching the phase information of the main clock signal based on a signal resulting from the synchronization.

2. An integrated AD (analog-to-digital) converter comprising:
 a comparator that compares an input voltage with a reference voltage with a ramp waveform whose voltage value linearly changes with time;
 a high-bit counter that is triggered by inversion of an output signal of the comparator to start or stop an operation of counting, wherein the counting operation, after being started, counts once for every cycle of a main clock signal until stopped;
 a time quantizer that latches phase information of a plurality of clock signals, the plurality of clock signals including the main clock signal with each clock signal having the same period as the main clock signal and having non-zero phase differences relative to each of the other clock signals, wherein the time quantizer latches the phase information at a timing at which the output signal of the comparator is inverted, and decodes a value of the latched phase information to thereby output bits with a resolution higher than a clock cycle of the main clock signal; and
 a regulating unit that synchronizes the output signal of the comparator with the main clock signal, and determines timings of starting and stopping the operation of the high-bit counter and a value for latching the phase information of the main clock signal by using a signal resulting from the synchronization, wherein the regulating unit includes a synchronization circuit that synchronizes the output signal of the comparator at both of rising and falling edges of the main clock signal, and outputs the synchronized signal as a count operation start signal, and generates a latch timing signal for latching phase information of the main clock signal based on the count operation start signal, and outputs the latch timing signal to the time quantizer, and the regulating unit is triggered by the count operation start signal to start a counting operation.

3. The integrated AD converter according to claim 2, wherein the time quantizer includes:

at least one first latch that latches phase information of a clock signal in a plurality of clock signals including the main clock signal, excluding the main clock signal, in synchronism with the output signal of the comparator; and a second latch that latches the phase information of the main clock signal in synchronism with the latch timing signal.

4. The integrated AD converter according to claim 3, wherein the second latch outputs a value which is an inverted logic value of the main clock signal.

5. The integrated AD converter according to claim 2, including a delay unit that delays the count operation start signal to generate the latch timing signal, and outputs the latch timing signal to the time quantizer.

6. A solid state imaging device comprising:

an pixel part having a matrix array of a plurality of pixels for performing photoelectric conversion; and a pixel signal reading part that reads pixel signals from the pixel part in units of a plurality of pixels, the pixel signal reading part having integrated AD (analog-to-digital) converters provided in correspondence to columns of pixels to convert read analog signals to digital signals, each of the integrated AD converters including:

a comparator that compares the potentials of analog signals read from the corresponding column of pixels with a reference voltage with a ramp waveform whose voltage value linearly changes with time, a high-bit counter that is triggered by inversion of an output signal of the comparator to start or stop an operation of counting, wherein the counting operation, after being started, counts once for every cycle of a main clock signal until stopped, a time quantizer that latches phase information of a plurality of clock signals, including the main clock signal, each clock signal having the same period as the main clock signal and having non-zero phase differences relative to each of the other clock signals, wherein the time quantizer latches the phase information at a timing at which the output signal of the comparator is inverted, and decodes a value of the latched phase information to thereby output bits with a resolution higher than a clock cycle of the main clock signal, and a regulating unit that synchronizes the output signal of the comparator with the main clock signal, and determines timings of starting and stopping the counting operation of the high-bit counter and a value for latching the phase information of the main clock signal based on a signal resulting from the synchronization.

7. A camera system comprising:

a solid state imaging device; and an optical system that forms an image of a subject on the solid state imaging device, the solid state imaging device having an pixel part having a matrix array of a plurality of pixels for performing photoelectric conversion, and a pixel signal reading part that reads pixel signals from the pixel part in units of a plurality of pixels, the pixel signal reading part having integrated AD (analog-to-digital) converters provided in correspondence to columns of pixels to convert read analog signals to digital signals, each of the integrated AD converters including:

a comparator that compares the potentials of analog signals read from the corresponding column of pixels with a reference voltage with a ramp waveform whose voltage value linearly changes with time, a high-bit counter that is triggered by inversion of an output signal of the comparator to start or stop an operation of counting, wherein the counting operation, after being started, counts once for every cycle of a main clock signal until stopped, a time quantizer that latches phase information at a timing at which the output signal of the comparator is inverted using a plurality of clock signals including main clock signals of different phases, and decodes a value of the latched phase information to thereby output bits with a resolution higher than a clock cycle of the main clock signal, and a regulating unit that synchronizes the output signal of the comparator with the main clock signal, and determines timings of starting and stopping the counting operation of the high-bit counter and a value for latching the phase information of the main clock signal based on a signal resulting from the synchronization.

8. The integrated AD converter according to claim 3, including a delay unit that delays the count operation start signal to generate the latch timing signal, and outputs the latch timing signal to the time quantizer.

9. The integrated AD converter according to claim 4, including a delay unit that delays the count operation start signal to generate the latch timing signal, and outputs the latch timing signal to the time quantizer.

* * * * *